United States Patent [19]

Smith et al.

[11] 4,000,370
[45] Dec. 28, 1976

[54] LINE LEVEL MICROPHONE WITH BUILT IN LIMITER

[75] Inventors: Alan Douglas Smith, Evanston; David Alan Yoshinari, Harwood Heights, both of Ill.

[73] Assignee: Shure Brothers Incorporated, Evanston, Ill.

[22] Filed: May 16, 1975

[21] Appl. No.: 578,123

[52] U.S. Cl. .................... 179/1 A; 179/1 F
[51] Int. Cl.² .................................. H04R 3/00
[58] Field of Search .......... 179/1 A, 1 F, 1 P, 1 VL; 307/237; 330/59

[56] References Cited

UNITED STATES PATENTS

| | | | |
|---|---|---|---|
| 2,208,752 | 7/1940 | Doba, Jr. | 179/1 VL |
| 3,290,442 | 12/1966 | Suganuma | 179/1 P |
| 3,296,373 | 1/1967 | Suganuma | 179/1 P |
| 3,300,584 | 1/1967 | Jeanlin | 179/1 VL |
| 3,488,750 | 1/1970 | Fujimoto | 179/1 VL |

FOREIGN PATENTS OR APPLICATIONS

| | | | |
|---|---|---|---|
| 726,253 | 1/1966 | Canada | 179/1 VL |

*Primary Examiner*—George G. Stellar
*Attorney, Agent, or Firm*—Allegretti, Newitt, Witcoff & McAndrews

[57] ABSTRACT

A line level microphone. The microphone includes an amplifier and a peak limiter variably shunting the input of the amplifier to substantially avoid distortion or clipping of the microphone output signal.

2 Claims, 3 Drawing Figures

LINE LEVEL MICROPHONE WITH BUILT IN LIMITER

BACKGROUND OF THE INVENTION

The present invention relates generally to a complete microphone assembly and more particularly to a microphone having a line level output and a peak limiter included within the microphone case or housing.

Fundamentally the line level microphone includes an amplifier to raise the voltage of the microphone transducer element to an average signal voltage of approximately 0.775 volts, when the microphone is loaded with a 600 ohm load. Microphones with line level output capability are used primarily in the broadcast industry for remote broadcasts or any other applications where long cable lengths are required or where the mirophone is connected directly to a telephone line.

In the presently known line level microphones, the internal amplifier has a fixed predetermined gain. Thus, with high sound pressure levels, as encountered with close talking usage, the amplifier overloads and distorts the output signal, i.e., clips the peaks of the output signal. If the gain is reduced, an insufficient output signal results whenever the sound pressure level is low.

SUMMARY OF THE INVENTION

In principal aspect, the present invention is a microphone including a transducer, amplifier, and peak limiter. The limiter controls the amplitude of the transducer signal, as received by the amplifier, in response to the magnitude of the amplifier output. That is, the limiter "limits" the amplifier output to a predetermined output level. More particularly, as the output signal level increases above a predetermined level, the limiter correspondingly reduces or attenuates the input signal to the amplifier.

It is thus an object of the present invention to provide a microphone having output signal limiting capability to substantially avoid overloading and distortion while maintaining a predetermined average output level.

It is another object of the present invention to provide a microphone including a limiter wherein the ratio of the input and output levels is substantially linear below a predetermined output level threshold, and thereafter, the output level remains substantially constant.

These and other objects, features and advantages of the present invention will become apparent in the following detailed description.

BRIEF DESCRIPTION OF THE DRAWINGS

A preferred embodiment of the present invention will be described in detail with reference to the drawing wherein.

DETAILED DESCRIPTION OF A PREFERRED EMBODIMENT

Figure 1:
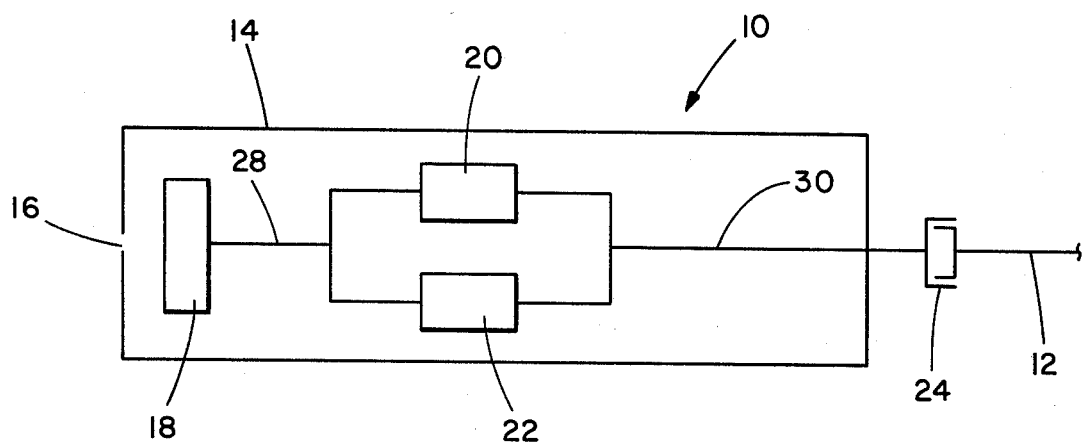
FIG. 1 is a schematic block diagram of a preferred embodiment of the present invention.
Figure 2:
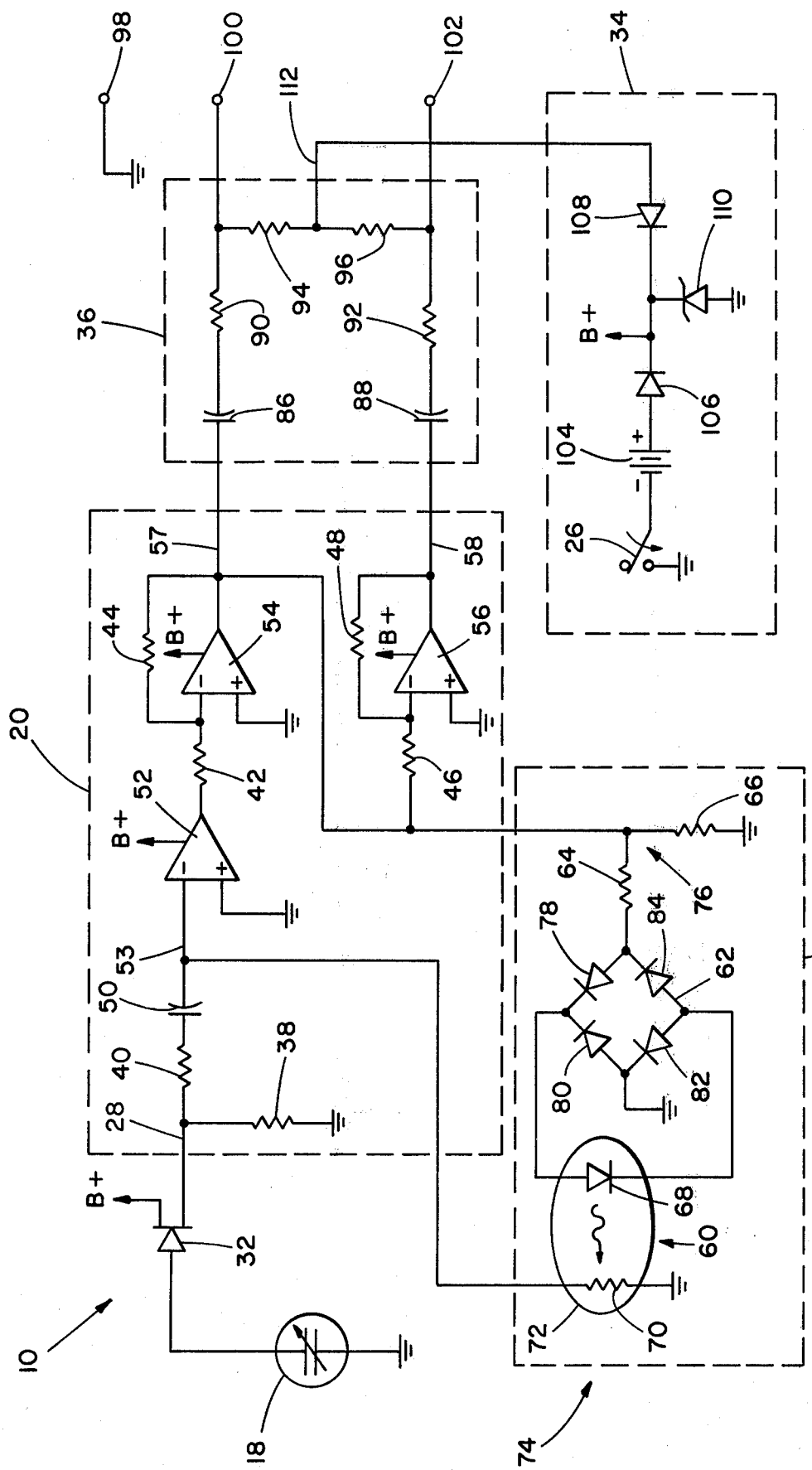
FIG. 2 is an electrical schematic diagram of the preferred embodiment shown in FIG. 1.

A preferred embodiment of the present invention is shown schematically in FIGS. 1 and 2. The complete assembly is designated as a microphone 10.

As shown, the microphone 10 includes a housing 14 having a sound inlet 16, a microphone transducer 18, an amplifier 20, a limiter 22 and a power supply 34. The transducer 18 may be a unidirectional or omnidirectional element of the condenser, capacitor or dynamic type.

In the preferred embodiment shown, the microphone 10 also includes an electrical connector 24 for connection with other equipment or a cable. For purposes of illustration alone, a telephone line 12 is shown in FIG. 1. The connector 24 includes a switch 26, shown in FIG. 2, which closes when a mating connector is coupled therewith. The closing of switch 26 energizes the amplifier 20 with power from the power supply 34.

In operation, the microphone transducer 18 responds to acoustic sound waves by producing an electrical signal at the input 28 of amplifier 20. This signal is amplified to produce an output signal at terminal 30. With amplification the output signal is substantially line level, i.e., nominally 0.775 volts for a 600 ohm load and normal acoustic inputs to the microphone 10.

A normal acoustic input is approximately a 94 dB sound pressure level. For transducer output levels greater than normal, the limiter 22 controls the amplifier input signal to substantially avoid distortion of the output signal, while maintaining line level. That is, the limiter 22 reduces or attenuates the amplifier input signal to substantially avoid clipping of the output signal peaks, caused by the overloading of amplifier 20.

The circuit elements of the microphone 10 are shown in greater detail in FIG. 2. The microphone 10 includes a field effect transistor 32 to substantially match the impedance of the transducer 18 to the amplifier 20.

As shown, the amplifier 20 includes resistors 38, 40, 42, 44, 46, 48, capacitor 50, preamplifier 52 having an input 53, and output amplifiers 54, 56, interconnected as shown. The output amplifiers 54, 56 have output terminals 57, 58, respectively. The output amplifier stages 54 and 56 are connected in a bridging configuration to provide a substantially balanced output.

The peak limiter 22 includes an optically coupled isolator, generally designated 60, a rectifier bridge circuit 62 and resistors 64, 66, connected as shown. The optically coupled isolator 60 includes a light emitting diode 68 and a photo-resistor 70, enclosed in a sealed tube 72. The photo-resistor 70 connects the input 53 of the preamplifier 52 to ground. The isolator 60 is presently available from Clairex Electronics, under the trade name "Optical Isolator", CLM6000.

The resistance of the photo-resistor 70 is inversely proportional to the amount of light produced and transmitted by the light emitting diode 68. As such, light emitting diode 68 and a photo-resistor 70 cooperatively define means, generally designated 74, for variably shunting the input terminal 28 of the amplifier 20 or, more particularly, the input 53 of preamplifier 52 to ground.

As shown, the light emitting diode 68 is driven by the output signal of the output amplifier 54 through the output terminals of the rectifier bridge circuit 62 and series resistor 64. The light emitted is proportional to the magnitude of the output signal. When the output signal level reaches a predetermined limit threshold, the light emitting diode 68 illuminates the variable resistance photo-resistor 70. The drop in resistance of the photo-resistor 70 effectively increases the shunting of input 53. That is, the variable shunting means 74, in response to an output level exceeding the predetermined limit threshold, reduces or attenuates the amplifier input signal thereby holding the output signal level substantially constant. Any further increase in output signal level further decreases the resistance of the photo-resistor 70 and further attenuates the input signal to the amplifier 20.

Figure 3:
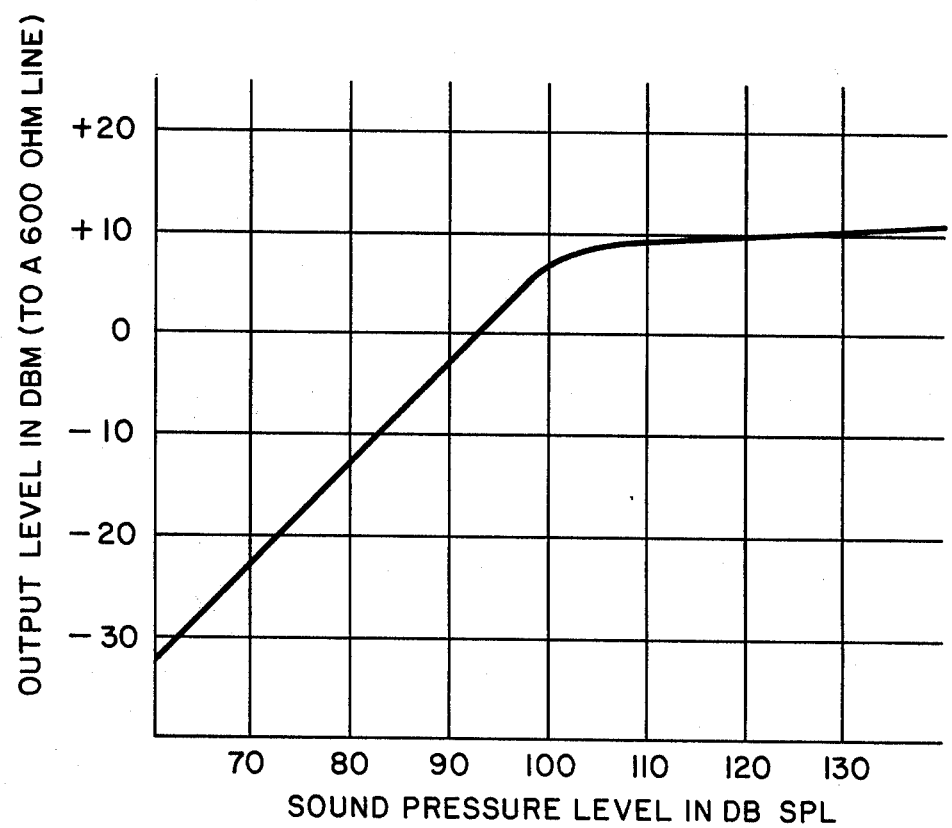
FIG. 3 is a graph illustrating the input/output level transfer function of the preferred embodiment shown in FIG. 1.

As shown in FIG. 3, the limit threshold of the variable shunting means 74 is preferably 6dBm. That is, the light emitting diode 68 begins to transmit when the output signal level reaches 6dBm. The limit threshold is defined by the resistor 64 and the characteristics of the bridge diodes 78, 80, 82, 84.

Thus, the input-output level transfer function of the microphone 10, as shown in FIG. 3, is substantially linear and determined by the characteristics of the amplifier 20 until the limit threshold is reached. Thereafter, the transfer function is substantially flat or constant. In actuality, the output voltage level rises nominally with an increase in sound pressure level.

The limiter 22 is a "peak responding limiter". That is, the limiter 22 reacts to peak levels of the output signal, as opposed to the average level. As such, the limiter 22 responds rapidly to increases in the output signal level. As an example, a user (not shown) counts from 1 to 10, as quickly as possible, shouting the numbers 3 and 7. Assuming the output signal level for the normally-spoken numbers is near the threshold, the output signal level for the entire sequence of numbers will be substantially equivalent.

The actual "attack" and "release" times of the limiter 22 are determined by the response characteristics of the optically coupled isolator 60. In this preferred embodiment, the attack time is typicaly 5 milliseconds for a 10dB input change, while the release time is typically 330 milliseconds for a 10 dB input change.

The output network 36 of the microphone 10 includes capacitors 86, 88, resistors 90, 92, 94, 96, and microphone output terminals 98, 100, 102, interconnected as shown. The capacitors 86, 88 A.C. couple the output amplifiers 54, 56 to the output terminals 100, 102, respectively, while blocking any D.C. voltages to protect the amplifiers 54, 56. The resistors 90, 92 provide short circuit protection for the output amplifiers 54, 56.

The resistors 94, 96 provide a low resistance D.C. path between the output terminals 100, 102 to hold a "dialed-up" telephone line. The resistors 94, 96, however, are sufficiently large to substantially avoid loading of the amplifier 20.

The power supply 34 includes the connection-actuated switch 26, a battery 104, diodes 106, 108 and zener diode 110, connected as shown. The diode 108, zener diode 110 and center tap connection 112 are used with an external simplex power supply. The diode 108 protects the circuitry of the power supply 34 from reversed polarity simplex connections and negative voltages on the telephone line 12. In this mode, the zener diode 110 maintains the supply voltage (B+) at 11 volts. The voltage of the battery 104 is preferably 9.8 volts, and thus the diode 106 is reversed-biased.

In the event of a simplex supply failure, the diode 106 becomes forward-biased and the battery 104 powers the microphone 10. Preferably, the battery 104 is a mercury type.

A single preferred embodiment of the present invention has been herein disclosed. It is to be understood, however, that various changes and modifications can be made without departing from the true scope and spirit of the present invention as set forth and defined in the following claims.

What is claimed is:

1. A microphone having a microphone output comprising, in combination:
   a transducer for converting sound waves into a voltage signal;
   an amplifier for amplifying said voltage signal to produce a microphone output signal, said amplifier having an amplifier input interconnected to said transducer and an amplifier output interconnected to said microphone output; and
   a limiter having a predetermined limit threshold for variably attenuating said voltage signal in response to said microphone output signal, said limiter attenuating said voltage signal whenever the magnitude of said microphone output signal exceeds said predetermined limit threshold, said limiter including a photo-resistor having a variable resistance connected to said amplifier input, a light emitting diode, a rectifier bridge and a resistance, said rectifier bridge and said resistance interconnecting said light emitting diode and said amplifier output, said light emitting diode being driven by said microphone output signal, said rectifier bridge, resistance and light emitting diode cooperatively defining said predetermined limit threshold, said photo-resistor and said light emitting diode cooperatively defining shunt means for variably shunting said amplifier input, whereby distortion of said voltage signal by said amplifier means is substantially avoided.

2. A microphone as claimed in claim 1 wherein said predetermined limit threshold is approximately 6dBm.

* * * * *